(12) United States Patent
Yeh et al.

(10) Patent No.: US 11,509,133 B2
(45) Date of Patent: Nov. 22, 2022

(54) TRANSIENT VOLTAGE SUPPRESSION DEVICE

(71) Applicant: AMAZING MICROELECTRONIC CORP., New Taipei (TW)

(72) Inventors: Chih-Ting Yeh, Zhudong Township (TW); Sung-Chih Huang, Jiaoxi Township (TW); Che-Hao Chuang, Jhudong Township (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 15 days.

(21) Appl. No.: 17/132,389

(22) Filed: Dec. 23, 2020

(65) Prior Publication Data

US 2022/0200272 A1     Jun. 23, 2022

(51) Int. Cl.
*H02H 9/04* (2006.01)
*H02H 9/00* (2006.01)

(52) U.S. Cl.
CPC .............. *H02H 9/04* (2013.01); *H02H 9/005* (2013.01); *H02H 9/046* (2013.01)

(58) Field of Classification Search
CPC ...... H01L 27/0255; H02H 9/005; H02H 9/04; H02H 9/041; H02H 9/046
See application file for complete search history.

(56) References Cited

U.S. PATENT DOCUMENTS

| 6,501,630 | B1 | 12/2002 | Colclaser et al. |
| 10,270,242 | B2 | 4/2019 | Chen |
| 10,468,513 | B1* | 11/2019 | Chen .................... H01L 29/0607 |
| 2005/0270712 | A1 | 12/2005 | Huang et al. |
| 2013/0314824 | A1* | 11/2013 | Lefferts ............... H01L 27/0251 361/56 |
| 2017/0302072 | A1* | 10/2017 | Chen .................... H05K 1/0259 |
| 2020/0043911 | A1* | 2/2020 | Chao .................... H01L 27/0259 |
| 2021/0384870 | A1* | 12/2021 | Kalb ......................... H03F 1/52 |

FOREIGN PATENT DOCUMENTS

| TW | 201025618 A1 | 7/2010 |
| TW | 202015180 A | 4/2020 |
| TW | 202017143 A | 5/2020 |

* cited by examiner

*Primary Examiner* — Jared Fureman
*Assistant Examiner* — Christopher J Clark
(74) *Attorney, Agent, or Firm* — Birch, Stewart, Kolasch & Birch, LLP

(57) ABSTRACT

A transient voltage suppression device includes at least one diode string, a power clamp device, at least one first bypass diode, and at least two second bypass diodes. The diode string is coupled between a power terminal and a common bus and coupled to an input output (I/O) port. The power clamp device is coupled between the power terminal and the common bus. The first bypass diode is coupled between the common bus and a ground terminal. The second bypass diodes are coupled in series, coupled between the common bus and the ground terminal, and coupled to the first bypass diode in reverse parallel. Alternatively, the first bypass diode and the second bypass diodes are replaced with at least one bi-directional electrostatic discharge (ESD) device.

8 Claims, 15 Drawing Sheets

TRANSIENT VOLTAGE SUPPRESSION DEVICE

BACKGROUND OF THE INVENTION

Field of the Invention

The present invention relates to a suppression device, particularly to a transient voltage suppression device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

In conventional technical field, transient voltage suppressors (TVS) are usually used to conduct an ESD protection. Refer to FIG. 1, FIG. 1 illustrates a circuit diagram of a conventional low-capacitance transient voltage suppressor. The transient voltage suppressor 1 includes a power clamp device 10 and a plurality of first diodes 12 and a plurality of second diodes 14. In order to reduce equivalent capacitances on current dissipation paths provided by the transient voltage suppressor, one or more diodes are usually arranged between input output terminals I/O1 and I/O2 and a power terminal PWR and between the input output terminals I/O1 and I/O2 and a ground terminal GND in conventional technical field so the equivalent capacitances on the current dissipation paths may be reduced through parasitic capacitances on the diodes connected in series. However, as the number of channels of the transient voltage suppressor increases, the diodes additionally arranged on each channel may cause a circuit area required by the transient voltage suppressor to increase significantly and thereby dramatically increase circuit costs.

To overcome the abovementioned problems, the present invention provides a transient voltage suppression device, so as to solve the afore-mentioned problems of the prior art.

SUMMARY OF THE INVENTION

The present invention provides a transient voltage suppression device, which flexibly adjusts and reduces the parasitic capacitance of an electrostatic discharge (ESD) path and adjusts the holding voltage of the ESD path under the premise that the circuit area may be saved.

In an embodiment of the present invention, a transient voltage suppression device includes at least one diode string, a power clamp device, at least one first bypass diode, and at least two second bypass diodes. The diode string is coupled between a power terminal and a common bus and coupled to an input output (I/O) port. The power clamp device is coupled between the power terminal and the common bus. The first bypass diode is coupled between the common bus and a ground terminal. The second bypass diodes is coupled in series, coupled between the common bus and the ground terminal, and coupled to the first bypass diode in reverse parallel.

In an embodiment of the present invention, the anode of the first bypass diode is coupled to the common bus. The cathode of the first bypass diode is coupled to the ground terminal. The cathode of the second bypass diodes is coupled to the common bus. The anode of the second bypass diodes is coupled to the ground terminal.

In an embodiment of the present invention, the diode string includes a first diode and a second diode. The anode of the first diode is coupled to the I/O port. The cathode of the first diode is coupled to the power terminal. The anode of the second diode is coupled to the common bus. The cathode of the second diode is coupled to the I/O port.

In an embodiment of the present invention, the at least one diode string includes a plurality of diode strings.

In an embodiment of the present invention, the at least one first bypass diode includes a plurality of first bypass diodes coupled in series.

In an embodiment of the present invention, a node between two of the plurality of first bypass diodes is coupled to a node between the second bypass diodes.

In an embodiment of the present invention, the cathode of the first bypass diode is coupled to the common bus. The anode of the first bypass diode is coupled to the ground terminal. The anode of the second bypass diodes is coupled to the common bus. The cathode of the second bypass diodes is coupled to the ground terminal.

In an embodiment of the present invention, a transient voltage suppression device includes at least one diode string, a power clamp device, and at least one bi-directional electrostatic discharge (ESD) device. The diode string coupled between a power terminal and a common bus and coupled to an input output (I/O) port is coupled between a power terminal and a common bus and coupled to an input output (I/O) port. The power clamp device is coupled between the power terminal and the common bus. The bi-directional electrostatic discharge device is coupled between the common bus and a ground terminal.

In an embodiment of the present invention, the diode string includes a first diode and a second diode. The anode of the first diode is coupled to the I/O port. The cathode of the first diode is coupled to the power terminal. The anode of the second diode is coupled to the common bus. The cathode of the second diode is coupled to the I/O port.

In an embodiment of the present invention, the bi-directional ESD device is a metal-oxide-semiconductor field effect transistor (MOSFET), a bipolar junction transistor (BJT), or a silicon-controlled rectifier (SCR).

In an embodiment of the present invention, the at least one diode string includes a plurality of diode strings.

In an embodiment of the present invention, the at least one bi-directional ESD device comprises a plurality of bi-directional ESD devices coupled in series.

In an embodiment of the present invention, the diode string and the power clamp device are formed in a semiconductor substrate. The semiconductor substrate has a first conductivity type. The bi-directional ESD device includes a first doped well, a second doped well, a first heavily-doped area, and a second heavily-doped area. The doped well, having a second conductivity type opposite to the first conductivity type, is formed in the semiconductor substrate. The second doped well, having the second conductivity type, is formed in the semiconductor substrate. The first heavily-doped area, having the second conductivity type, is formed in the first doped well and coupled to the common bus. The second heavily-doped area, having the first conductivity type, is formed in the first doped well and coupled to the common bus. The third heavily-doped area, having the second conductivity type, is formed in the second doped well and coupled to the ground terminal. The fourth heavily-doped area, having the first conductivity type, is formed in the second doped well and coupled to the ground terminal.

In an embodiment of the present invention, the first conductivity type is an N type and the second conductivity type is a P type.

In an embodiment of the present invention, the first conductivity type is a P type and the second conductivity type is an N type.

In an embodiment of the present invention, the diode string and the power clamp device are formed in a semiconductor substrate. The semiconductor substrate has a first conductivity type. The bi-directional ESD device includes a doped well, a first heavily-doped area, and a second heavily-doped area. The doped well, having a second conductivity type opposite to the first conductivity type, is formed in the semiconductor substrate. The doped well is floating. The first heavily-doped area, having the first conductivity type, is formed in the doped well and coupled to the ground terminal. The second heavily-doped area, having the first conductivity type, is formed in the doped well and coupled to the common bus.

In an embodiment of the present invention, the bi-directional ESD device further includes an insulation layer and an electrode layer sequentially formed on the doped well. The electrode layer is floating.

To sum up, the transient voltage suppression device connects either the at least one first bypass diode and the at least two second bypass diodes or the at least one bi-directional electrostatic discharge (ESD) device to adjust and reduce the parasitic capacitance of an electrostatic discharge (ESD) path and adjust the holding voltage of the ESD path under the premise that the circuit area may be saved.

Below, the embodiments are described in detail in cooperation with the drawings to make easily understood the technical contents, characteristics and accomplishments of the present invention.

DETAILED DESCRIPTION OF THE INVENTION

Figure 1:
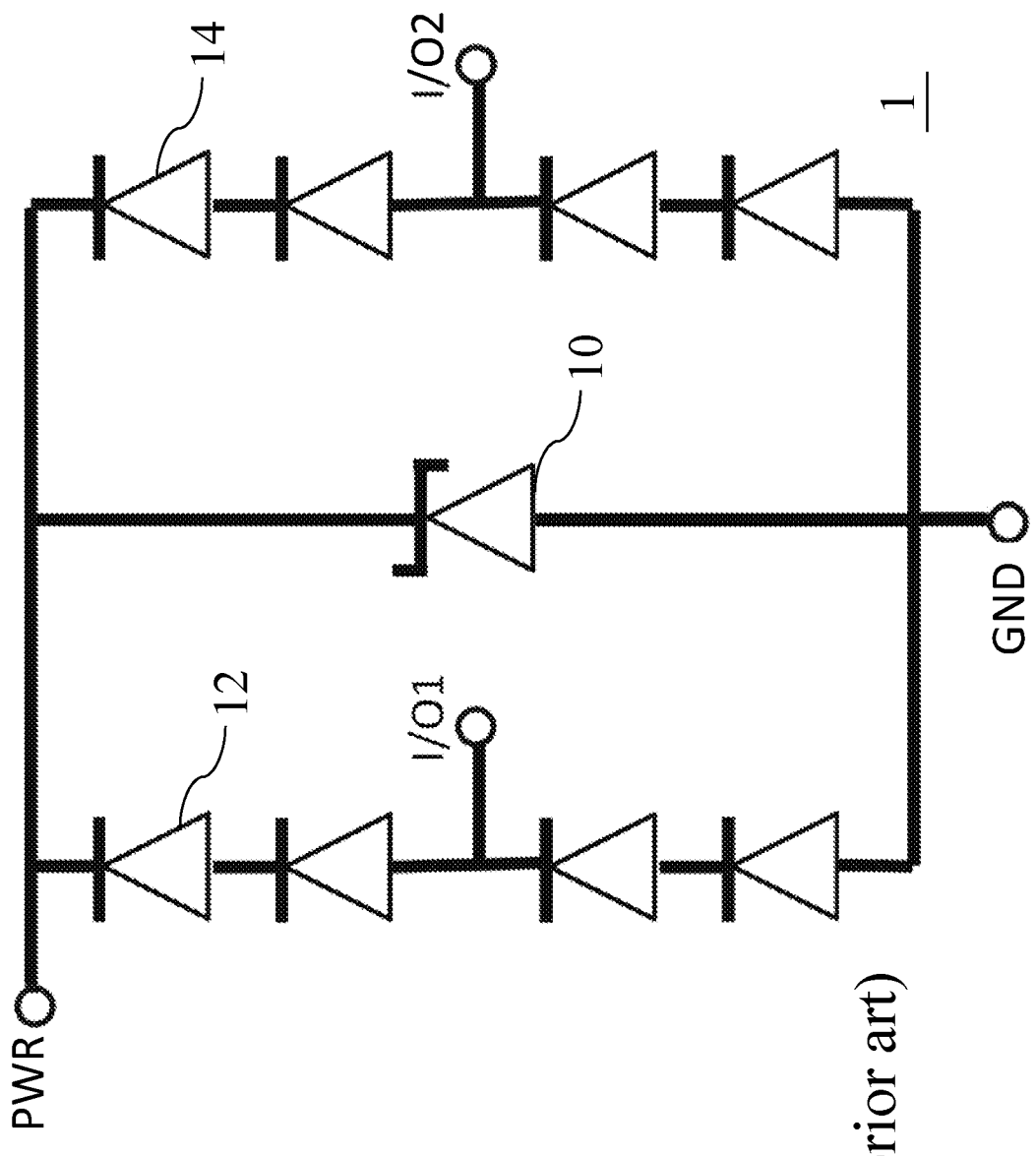
FIG. 1 is a schematic diagram illustrating a transient voltage suppressor in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

For the purpose of flexibly adjusting and reducing the parasitic capacitance of an electrostatic discharge (ESD) path and adjusts the holding voltage of the ESD path under the premise that the circuit area may be saved, a transient voltage suppression device is provided.

Figure 2:
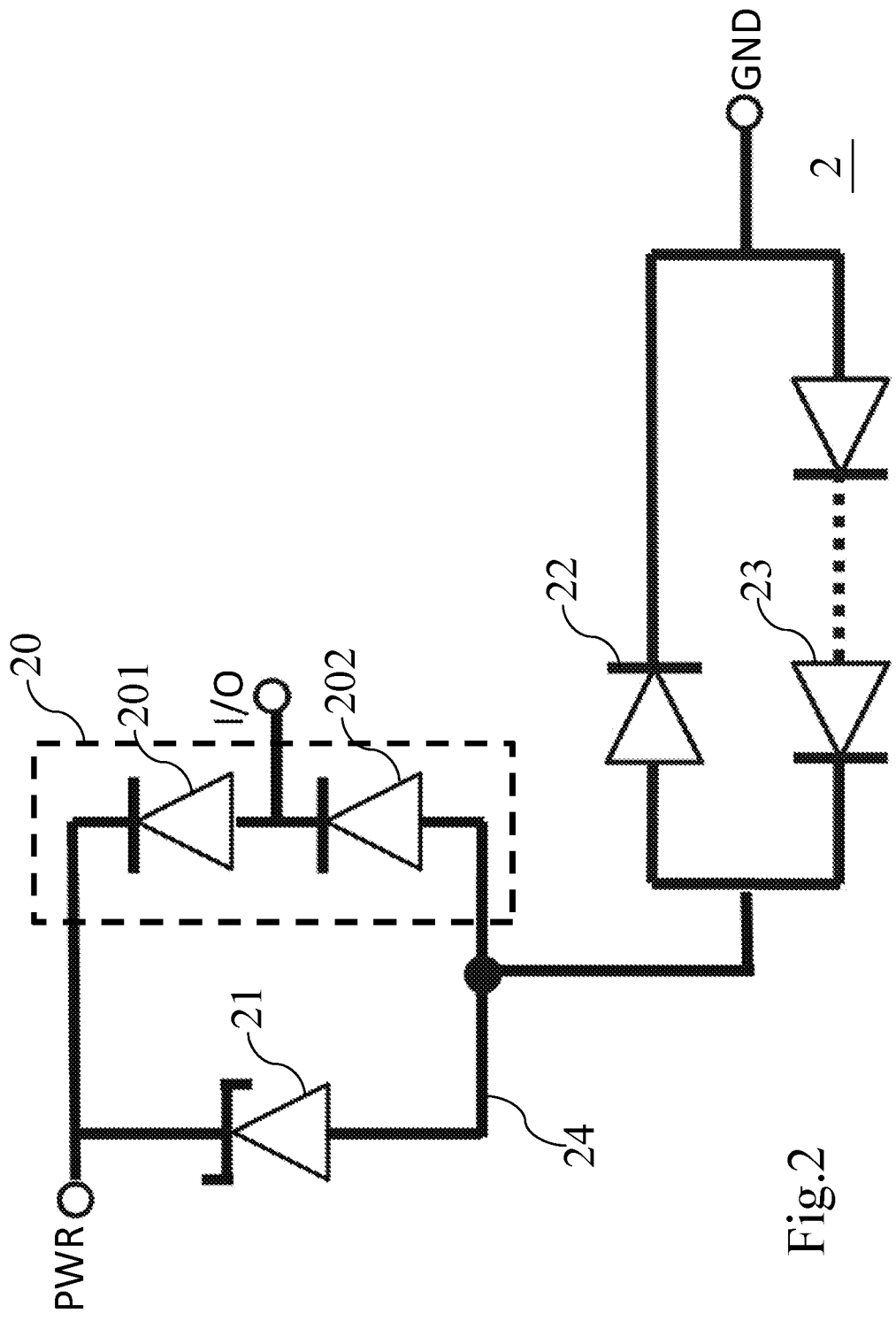
FIG. 2 is a schematic diagram illustrating a transient voltage suppression device according to a first embodiment of the present invention.

FIG. 2 is a schematic diagram illustrating a transient voltage suppression device according to a first embodiment of the present invention. Referring to FIG. 2, the transient voltage suppression device 2 includes at least one diode string 20, a power clamp device 21, at least one first bypass diode 22, and at least two second bypass diodes 23. The power clamp device 21 may be a Zener diode, a bipolar junction transistor, a silicon-controlled rectifier, or a metal-oxide-semiconductor field-effect transistor. The diode string 20 is coupled between a power terminal PWR and a common bus 24 and coupled to an input output (I/O) port. The power clamp device 21 is coupled between the power terminal PWR and the common bus 24. The first bypass diode 22 is coupled between the common bus 24 and a ground terminal GND. The second bypass diodes 23 are coupled in series, coupled between the common bus 24 and the ground terminal GND, and coupled to the first bypass diode 22 in reverse parallel. Specifically, the anode of the first bypass diode 22 is coupled to the common bus 24. The cathode of the first bypass diode 22 is coupled to the ground terminal GND. The cathode of the second bypass diode 23 most near to the common bus 24 is coupled to the common bus 24. The anode of the second bypass diode 23 most near to the ground terminal GND is coupled to the ground terminal GND.

In some embodiment of the present invention, the diode string 20 may include a first diode 201 and a second diode 202. The anode of the first diode 201 is coupled to the I/O port. The cathode of the first diode 201 is coupled to the power terminal PWR. The anode of the second diode 202 is coupled to the common bus 24. The cathode of the second diode 202 is coupled to the I/O port.

The operation of the transient voltage suppression device 2 is introduced as follows. When an electrostatic discharge voltage higher than the ground voltage of the ground terminal GND appears at the I/O port, an electrostatic discharge current flows from the I/O port to the ground terminal GND through the first diode 201, the power clamp device 21, the common bus 24, and the first bypass diode 22. When an electrostatic discharge voltage lower than the ground voltage of the ground terminal GND appears at the I/O port, an electrostatic discharge current flows from the ground terminal GND to the I/O port through the second bypass diodes 23, the common bus 24, and the second diode 202.

In view of the above description, it can be known that, in the first embodiment of the present invention, one current dissipation path may be generated by arranging the first diode 201 between the I/O port and the power terminal PWR in cooperation with the first bypass diode 22. Further, another current dissipation path may be generated by arranging the second diode 202 between the I/O port and the common bus 24 in cooperation with the second bypass diodes 23. As a result, the electrostatic discharge currents generated by different conditions of the ESD phenomenon may both be dissipated to achieve the effectiveness of ESD protection. The point is that, the equivalent capacitances on the current dissipation paths may all be effectively reduced and adjusted through the first bypass diode 22 coupled to the first diode 201 in series or through the second bypass diodes 23 coupled to the second diode 202 in series to improve the effectiveness of the ESD protection. Besides, due to the first bypass diode 22 and the second bypass diodes 23, the holding voltage of the current dissipation paths may be flexibly adjusted.

By arranging the first bypass diode 22 and the second bypass diodes 23 as shown in the first embodiment of the present invention, regardless of how many channels are provided by the transient voltage suppression device 2, the equivalent capacitances on the current dissipation paths may all be effectively reduced without correspondingly arranging additional diodes, such that a layout area required by the transient voltage suppression device 2 may be effectively saved.

Figure 3:
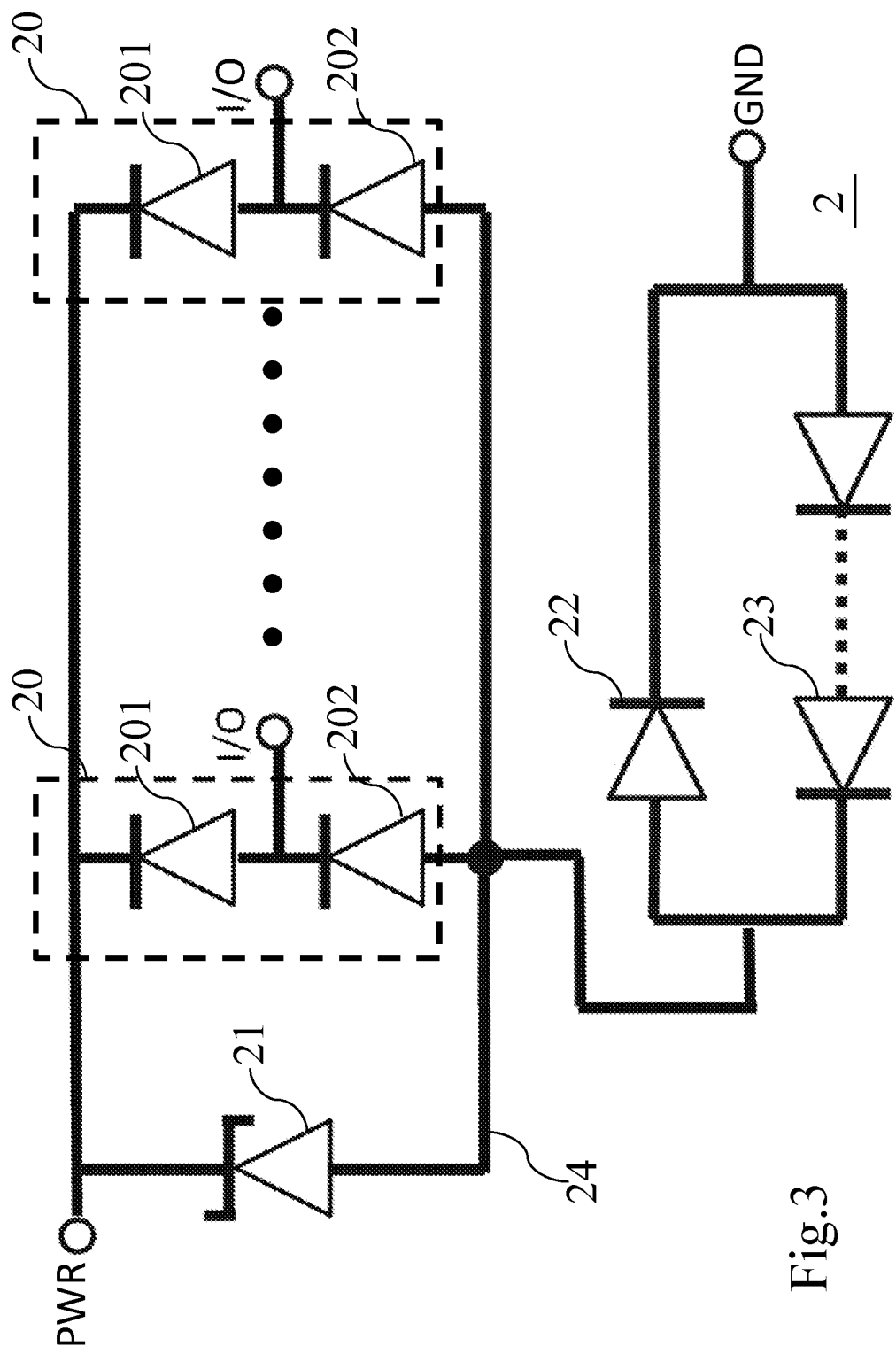
FIG. 3 is a schematic diagram illustrating a transient voltage suppression device according to a second embodiment of the present invention.

FIG. 3 is a schematic diagram illustrating a transient voltage suppression device according to a second embodiment of the present invention. Referring to FIG. 3, the second embodiment is different from the first embodiment in the number of the diode strings 20. The second embodiment exemplifies a plurality of diode strings 20 each coupled to one I/O port. The anode of the first bypass diode 22 and the cathode of the second bypass diode 23 are coupled to the common bus 24.

Figure 4:
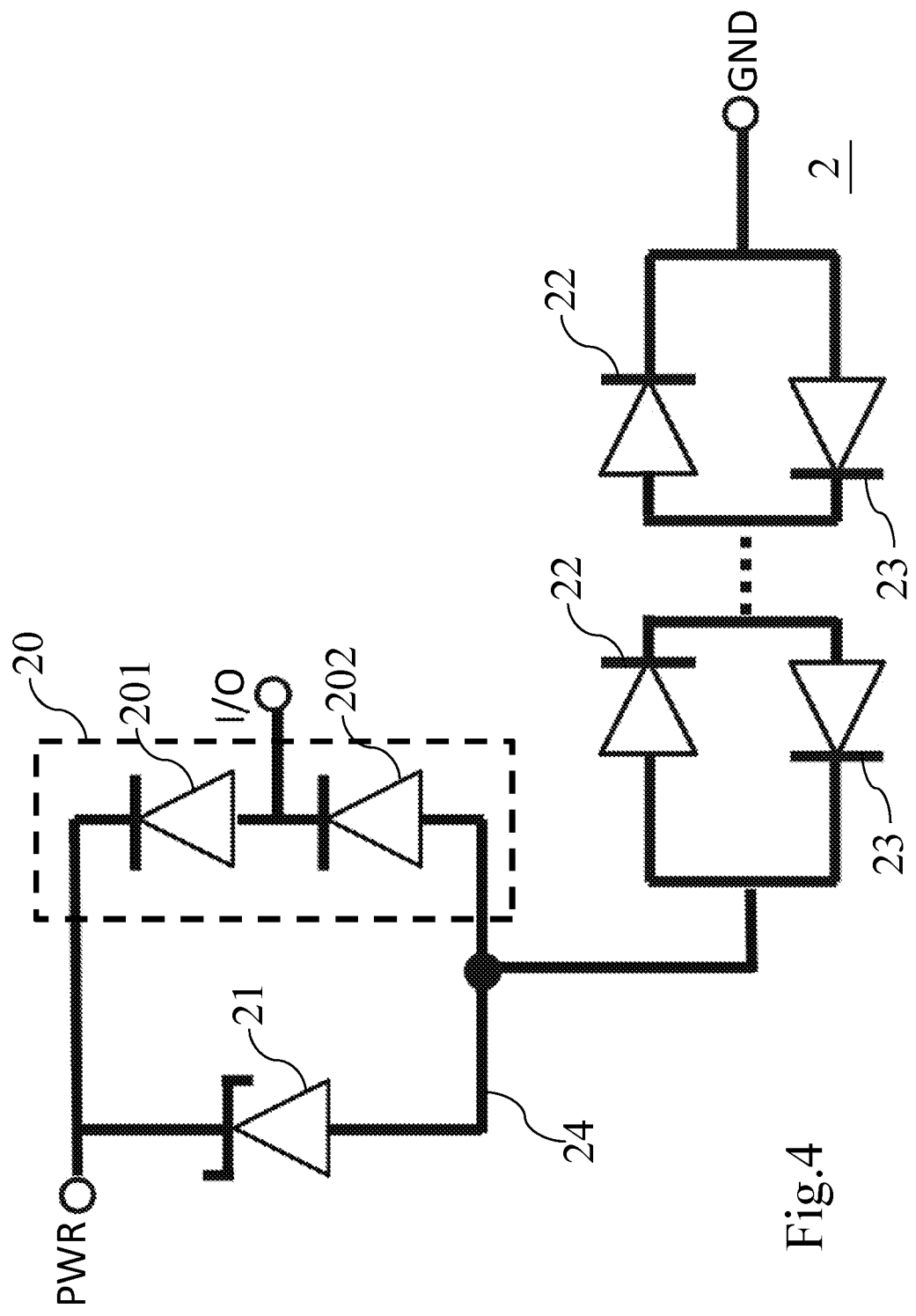
FIG. 4 is a schematic diagram illustrating a transient voltage suppression device according to a third embodiment of the present invention.

FIG. 4 is a schematic diagram illustrating a transient voltage suppression device according to a third embodiment of the present invention. Referring to FIG. 4, the third embodiment of the transient voltage suppression device 2 is introduced as follows. The third embodiment is different from the first embodiment in the first bypass diode 22 and the second bypass diodes 23. The third embodiment exemplifies a plurality of first bypass diodes 22 coupled in series. For adjusting the equivalent capacitances on the current dissipation paths, a node between two of the plurality of first bypass diodes 22 may be coupled to a node between the second bypass diodes 23. Assume that there are first nodes among the plurality of first bypass diodes 22 and that there are second nodes among the plurality of second bypass diodes 23. In a preferred embodiment, the first nodes are respectively coupled to the second nodes.

Figure 5:
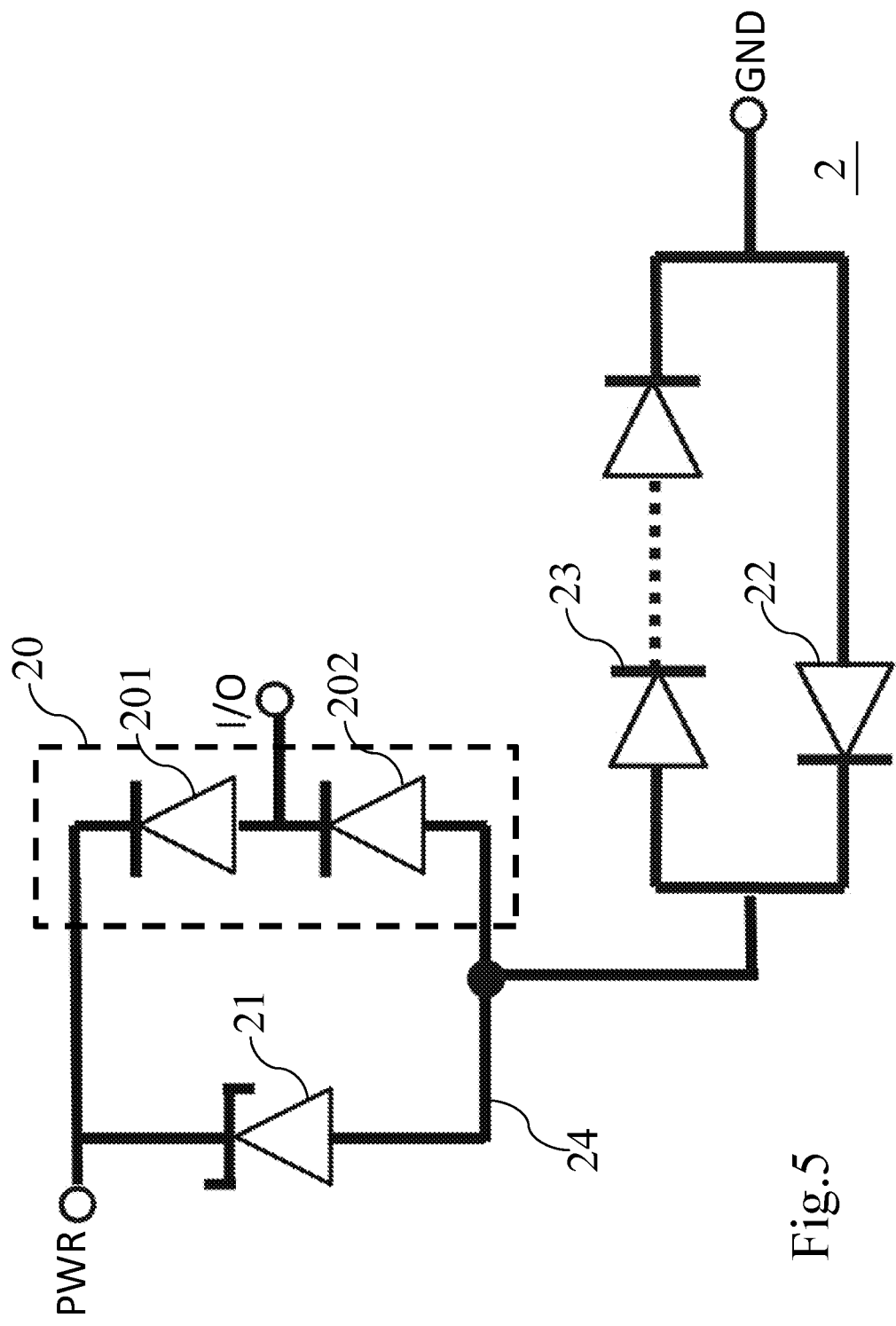
FIG. 5 is a schematic diagram illustrating a transient voltage suppression device according to a fourth embodiment of the present invention.

FIG. 5 is a schematic diagram illustrating a transient voltage suppression device according to a fourth embodiment of the present invention. Referring to FIG. 5, the transient voltage suppression device 2 includes at least one diode string 20, a power clamp device 21, at least one first bypass diode 22, and at least two second bypass diodes 23. The diode string 20 is coupled between a power terminal PWR and a common bus 24 and coupled to an input output (I/O) port. The power clamp device 21 is coupled between the power terminal PWR and the common bus 24.

The first bypass diode 22 is coupled between the common bus 24 and a ground terminal GND. The second bypass diodes 23 are coupled in series, coupled between the common bus 24 and the ground terminal GND, and coupled to the first bypass diode 22 in reverse parallel. Specifically, the cathode of the first bypass diode 22 is coupled to the common bus 24. The anode of the first bypass diode 22 is coupled to the ground terminal GND. The anode of the second bypass diode 23 most near to the common bus 24 is coupled to the common bus 24. The cathode of the second bypass diode 23 most near to the ground terminal GND is coupled to the ground terminal GND.

In some embodiment of the present invention, the diode string 20 may include a first diode 201 and a second diode 202. The anode of the first diode 201 is coupled to the I/O port. The cathode of the first diode 201 is coupled to the power terminal PWR. The anode of the second diode 202 is coupled to the common bus 24. The cathode of the second diode 202 is coupled to the I/O port.

The operation of the transient voltage suppression device 2 is introduced as follows. When an electrostatic discharge voltage higher than the ground voltage of the ground terminal GND appears at the I/O port, an electrostatic discharge current flows from the I/O port to the ground terminal GND through the first diode 201, the power clamp device 21, the common bus 24, and the second bypass diodes 23. When an electrostatic discharge voltage lower than the ground voltage of the ground terminal GND appears at the I/O port, an electrostatic discharge current flows from the ground terminal GND to the I/O port through the first bypass diodes 22, the common bus 24, and the second diode 202.

In view of the above description, it can be known that, in the fourth embodiment of the present invention, one current dissipation path may be generated by arranging the first diode 201 between the I/O port and the power terminal PWR in cooperation with the second bypass diodes 23. Further, another current dissipation path may be generated by arranging the second diode 202 between the I/O port and the common bus 24 in cooperation with the first bypass diode 22. As a result, the electrostatic discharge currents generated by different conditions of the ESD phenomenon may both be dissipated to achieve the effectiveness of ESD protection. The point is that, the equivalent capacitances on the current dissipation paths may all be effectively reduced and adjusted through the second bypass diodes 23 coupled to the first diode 201 in series or through the first bypass diode 22 coupled to the second diode 202 in series to improve the effectiveness of the ESD protection. Besides, due to the first bypass diode 22 and the second bypass diodes 23, the holding voltage of the current dissipation paths may be flexibly adjusted.

By arranging the first bypass diode 22 and the second bypass diodes 23 as shown in the fourth embodiment of the present invention, regardless of how many channels are provided by the transient voltage suppression device 2, the equivalent capacitances on the current dissipation paths may all be effectively reduced without correspondingly arranging additional diodes, such that a layout area required by the transient voltage suppression device 2 may be effectively saved.

Figure 6:
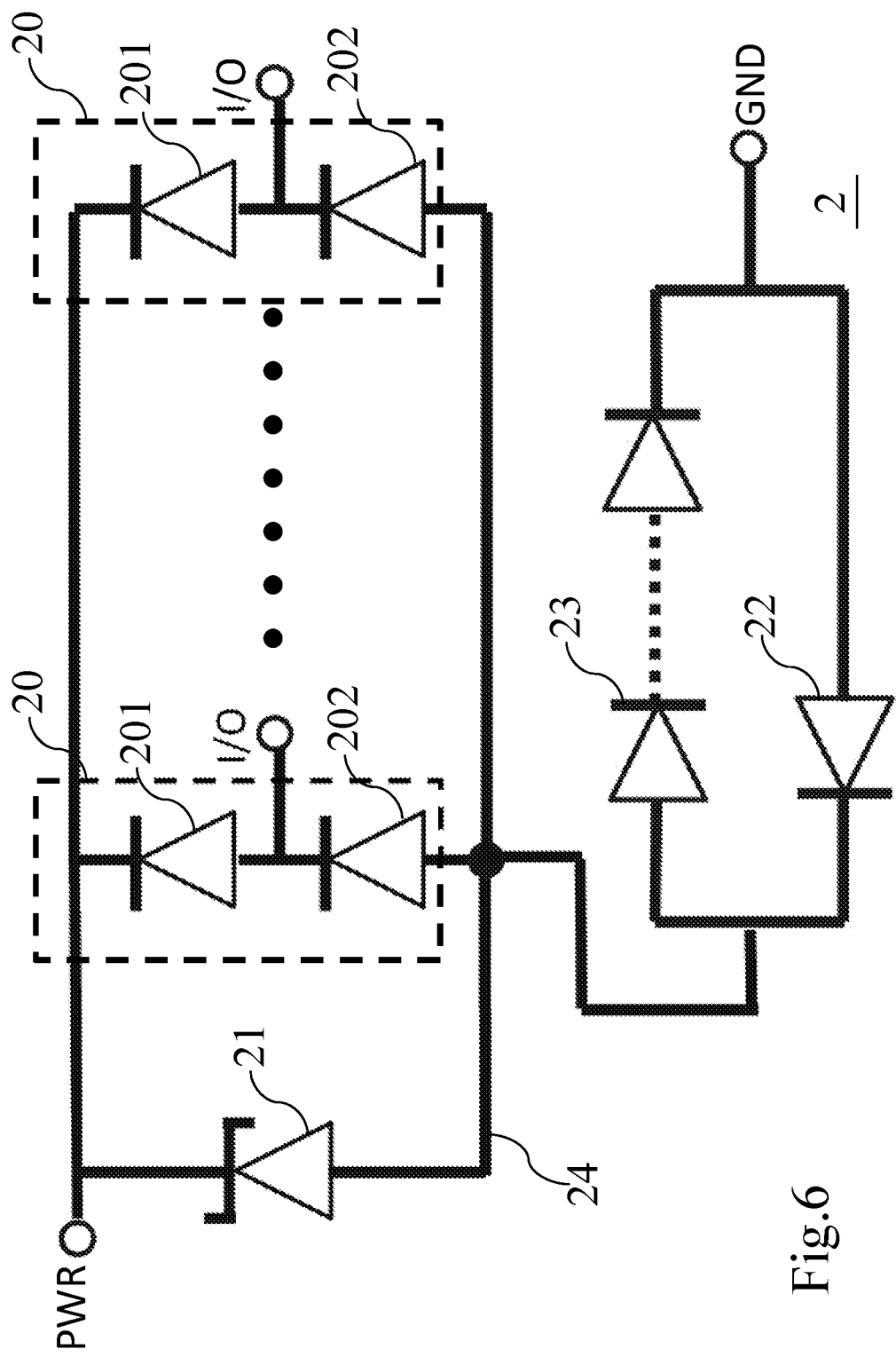
FIG. 6 is a schematic diagram illustrating a transient voltage suppression device according to a fifth embodiment of the present invention.
Figure 7:
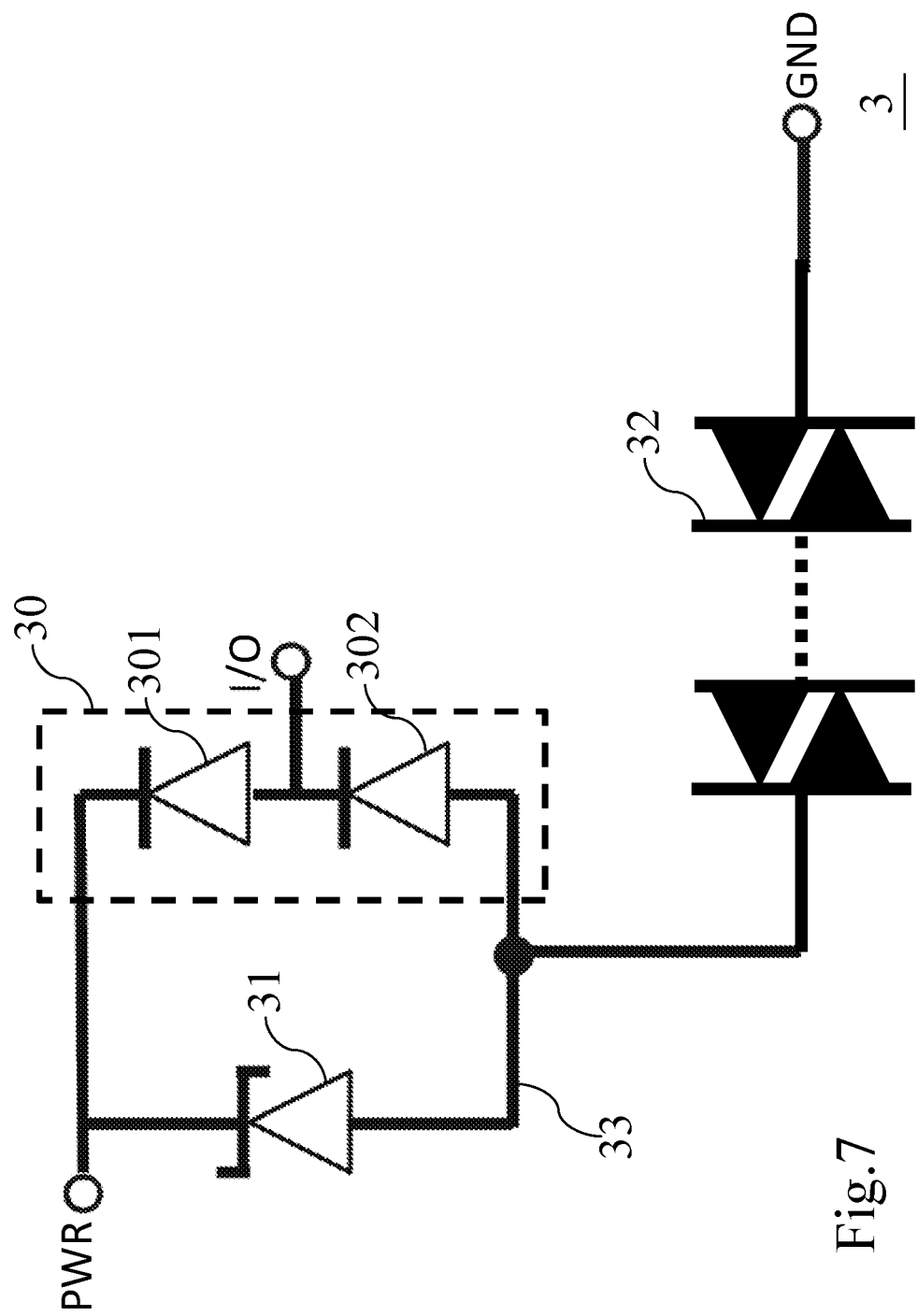
FIG. 7 is a schematic diagram illustrating a transient voltage suppression device according to a sixth embodiment of the present invention.

FIG. 6 is a schematic diagram illustrating a transient voltage suppression device according to a fifth embodiment of the present invention. Referring to FIG. 6, the fifth embodiment is different from the fourth embodiment in the number of the diode strings 20. The fifth embodiment exemplifies a plurality of diode strings 20 each coupled to one I/O port. The cathode of the first bypass diode 22 and the anode of the second bypass diode 23 are coupled to the common bus 24. FIG. 7 is a schematic diagram illustrating a transient voltage suppression device according to a sixth embodiment of the present invention. Referring to FIG. 7, the transient voltage suppression device 3 includes at least one diode string 30, a power clamp device 31, and at least one bi-directional electrostatic discharge (ESD) device 32. The diode string 30 is coupled between a power terminal PWR and a common bus 33 and coupled to an input output (I/O) port. The power clamp device 31 is coupled between the power terminal PWR and the common bus 33. The bi-directional electrostatic discharge device 32, such as a metal-oxide-semiconductor field effect transistor (MOSFET), a bipolar junction transistor (BJT), or a silicon-controlled rectifier (SCR), is coupled between the common bus 33 and a ground terminal GND. In some embodiment of the present invention, a plurality of bi-directional ESD devices 32 coupled in series can be used. Compared with the first and fourth embodiments, the bi-directional electrostatic discharge device 32 replaces the first bypass diode and the second bypass diode to reduce the more layout area. Besides, the bi-directional electrostatic discharge device 32 has a current gain and a lower holding voltage. Thus, under the same layout area, the bi-directional electrostatic discharge device 32 has better ESD performance than a diode. In general, when an ESD component has a higher breakdown voltage, the ESD robustness level of the ESD component is lower since the ESD component is easily burnt out. When the bi-directional electrostatic discharge device 32 having a higher breakdown voltage cooperates with ESD clamping components between bus lines to sustain the operating voltage of an internal circuit, the ESD clamping components can be designed to have lower breakdown voltage. As a result, the entire ESD protection circuit has a higher ESD robustness level.

In some embodiment of the present invention, the diode string 30 may include a first diode 301 and a second diode 302. The anode of the first diode 301 is coupled to the I/O port. The cathode of the first diode 301 is coupled to the power terminal PWR. The anode of the second diode 302 is coupled to the common bus 33. The cathode of the second diode 302 is coupled to the I/O port.

The operation of the transient voltage suppression device 3 is introduced as follows. When an electrostatic discharge voltage higher than the ground voltage of the ground terminal GND appears at the I/O port, an electrostatic discharge current flows from the I/O port to the ground terminal GND through the first diode 301, the power clamp device 31, the common bus 33, and the bi-directional electrostatic discharge device 32. When an electrostatic discharge voltage lower than the ground voltage of the ground terminal GND appears at the I/O port, an electrostatic discharge current flows from the ground terminal GND to the I/O port through the bi-directional electrostatic discharge device 32, the common bus 33, and the second diode 302.

In view of the above description, it can be known that, in the sixth embodiment of the present invention, one current dissipation path may be generated by arranging the first diode 301 between the I/O port and the power terminal PWR in cooperation with the bi-directional electrostatic discharge device 32. Further, another current dissipation path may be generated by arranging the second diode 302 between the I/O port and the common bus 33 in cooperation with the bi-directional electrostatic discharge device 32. As a result, the electrostatic discharge currents generated by different conditions of the ESD phenomenon may both be dissipated to achieve the effectiveness of ESD protection. The point is that, the equivalent capacitances on the current dissipation paths may all be effectively reduced and adjusted through the bi-directional electrostatic discharge device 32 coupled to the first diode 301 in series or coupled to the second diode 302 in series to improve the effectiveness of the ESD protection. Besides, due to the bi-directional electrostatic discharge device 32, the holding voltage of the current dissipation paths may be flexibly adjusted.

By arranging the bi-directional electrostatic discharge device 32 as shown in the sixth embodiment of the present invention, regardless of how many channels are provided by the transient voltage suppression device 3, the equivalent capacitances on the current dissipation paths may all be effectively reduced without correspondingly arranging additional diodes, such that a layout area required by the transient voltage suppression device 3 may be effectively saved.

Figure 8:
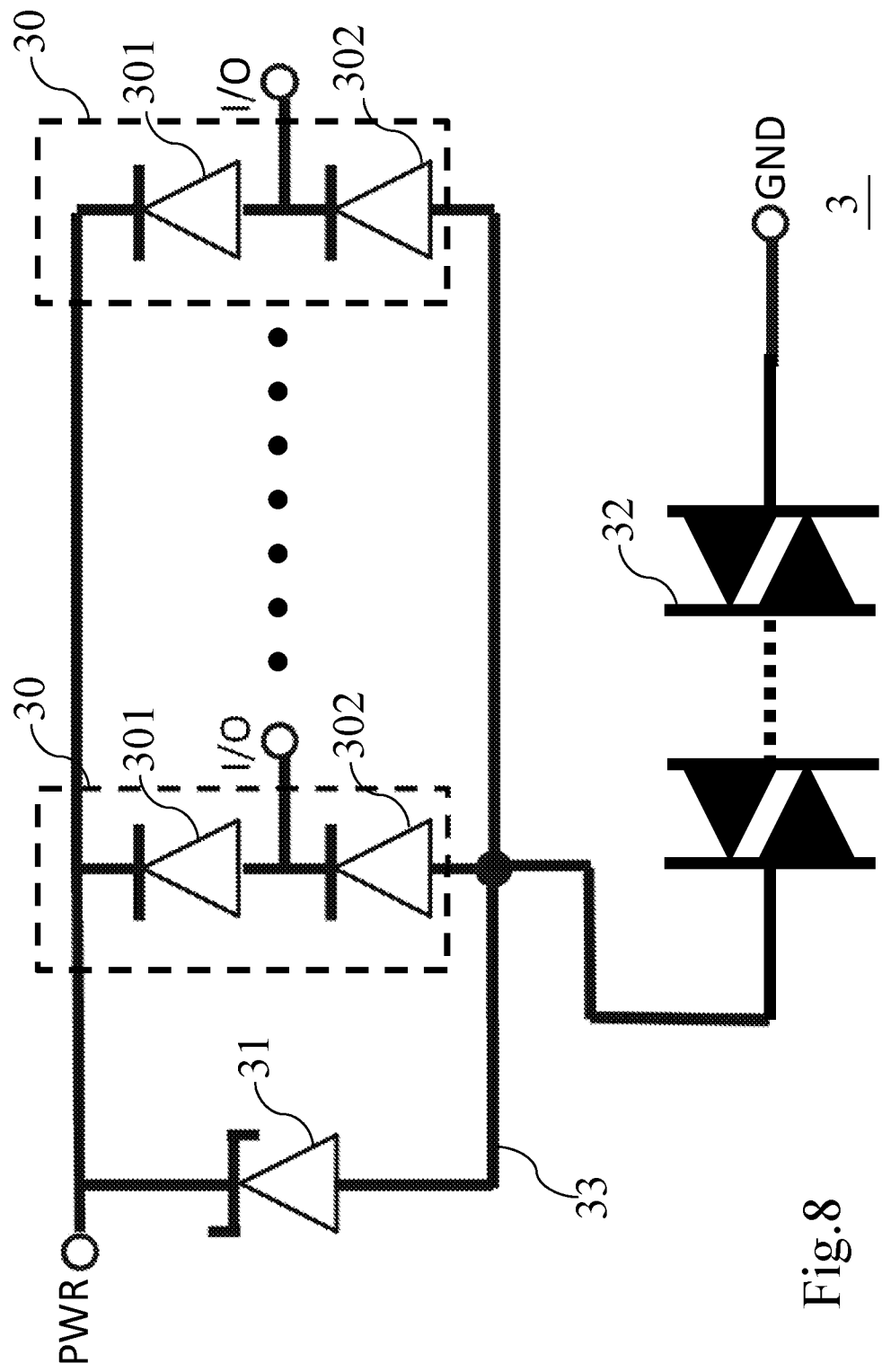
FIG. 8 is a schematic diagram illustrating a transient voltage suppression device according to a seventh embodiment of the present invention.
Figure 9:
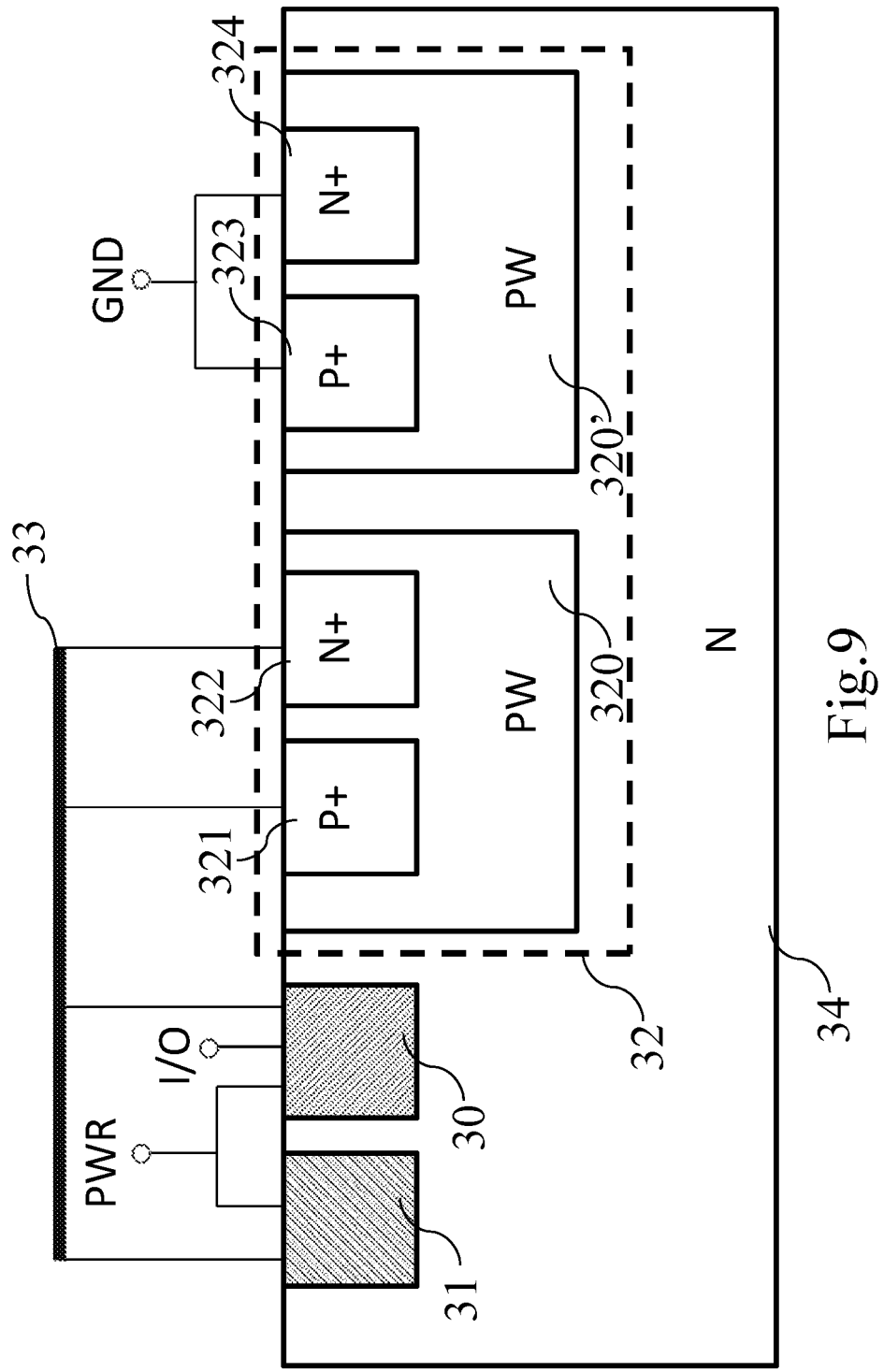
FIG. 9 is a cross-sectional view of a transient voltage suppression device according to a first implementation corresponding to the sixth embodiment of the present invention.

FIG. 8 is a schematic diagram illustrating a transient voltage suppression device according to a seventh embodiment of the present invention. Referring to FIG. 8, the seventh embodiment is different from the sixth embodiment in the number of the diode strings 30. The seventh embodiment exemplifies a plurality of diode strings 30 each coupled to one I/O port. The bi-directional electrostatic discharge device 32 is coupled to the common bus 33. FIG. 9 is a cross-sectional view of a transient voltage suppression device according to a first implementation corresponding to the sixth embodiment of the present invention. Referring to FIG. 9, the diode string 30 and the power clamp device 31 are formed in a semiconductor substrate 34. The semiconductor substrate 34 has a first conductivity type. The bi-directional ESD device 32 is exemplified by a silicon-controlled rectifier. The bi-directional ESD device 32 may include a first doped well 320, a first heavily-doped area 321, a second heavily-doped area 322, a third heavily-doped area 323, a fourth heavily-doped area 324, and a second doped well 320'. The first doped well 320, having a second conductivity type opposite to the first conductivity type, is formed in the semiconductor substrate 34. In the first implementation, the first conductivity type is an N type and the second conductivity type is a P type. The second doped well 320', having the second conductivity type, is formed in the semiconductor substrate 34. The first heavily-doped area 321, having the second conductivity type, is formed in the first doped well 320 and coupled to the common bus 33. The second heavily-doped area 322, having the first conductivity type, is formed in the first doped well 320 and coupled to the common bus 33.

The third heavily-doped area 323, having the second conductivity type, is formed in the second doped well 320' and coupled to the ground terminal GND. The fourth heavily-doped area 324, having the first conductivity type, is formed in the second doped well 320' and coupled to the ground terminal GND.

Figure 10:
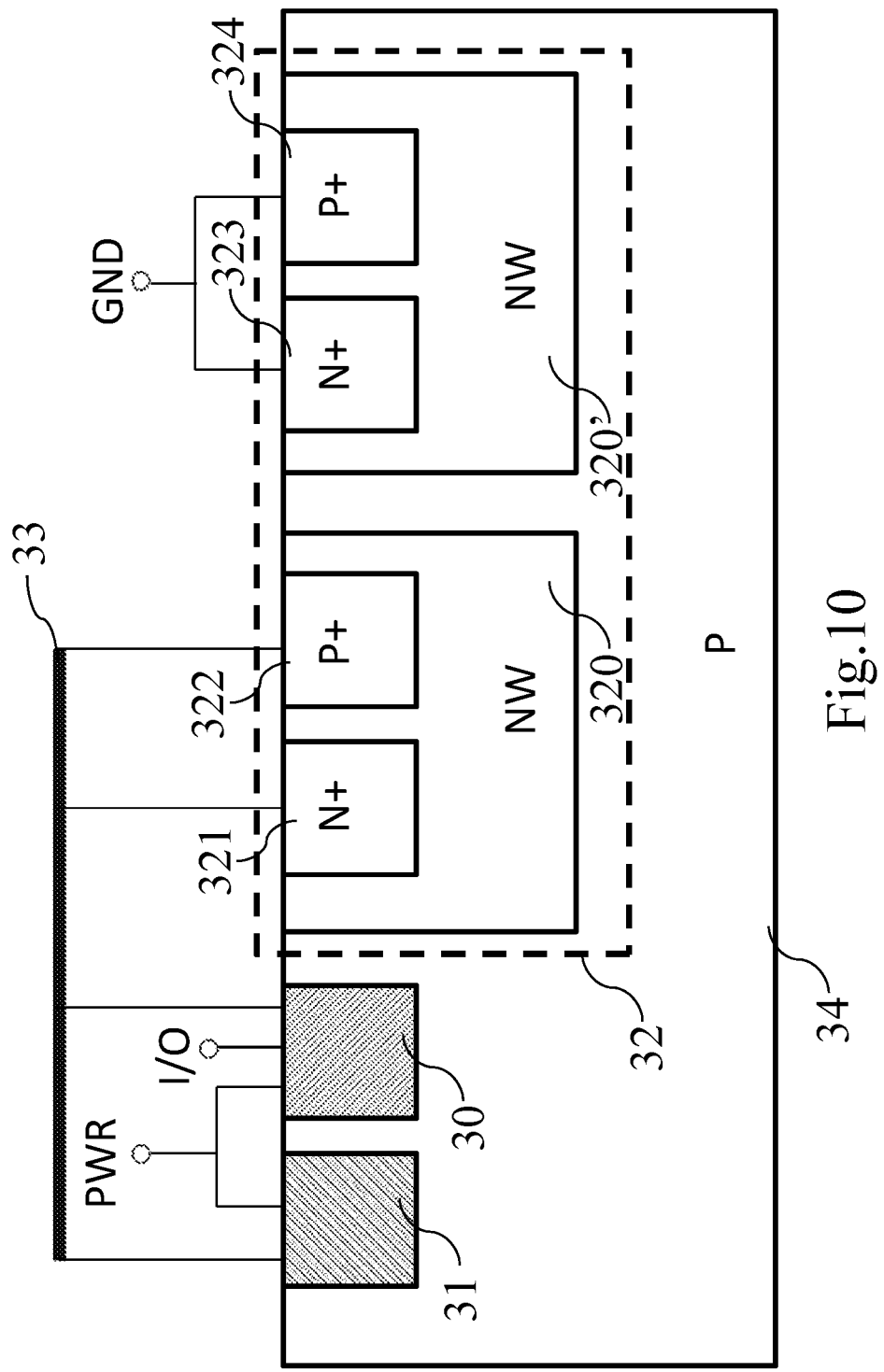
FIG. 10 is a cross-sectional view of a transient voltage suppression device according to a second implementation corresponding to the sixth embodiment of the present invention.

FIG. 10 is a cross-sectional view of a transient voltage suppression device according to a second implementation corresponding to the sixth embodiment of the present invention. The second implementation is different from the first implementation in the conductivity type. In the second implementation, the first conductivity type is a P type and the second conductivity type is an N type. The other structures have been described previously in the first implementation so will not be reiterated.

Figure 11:
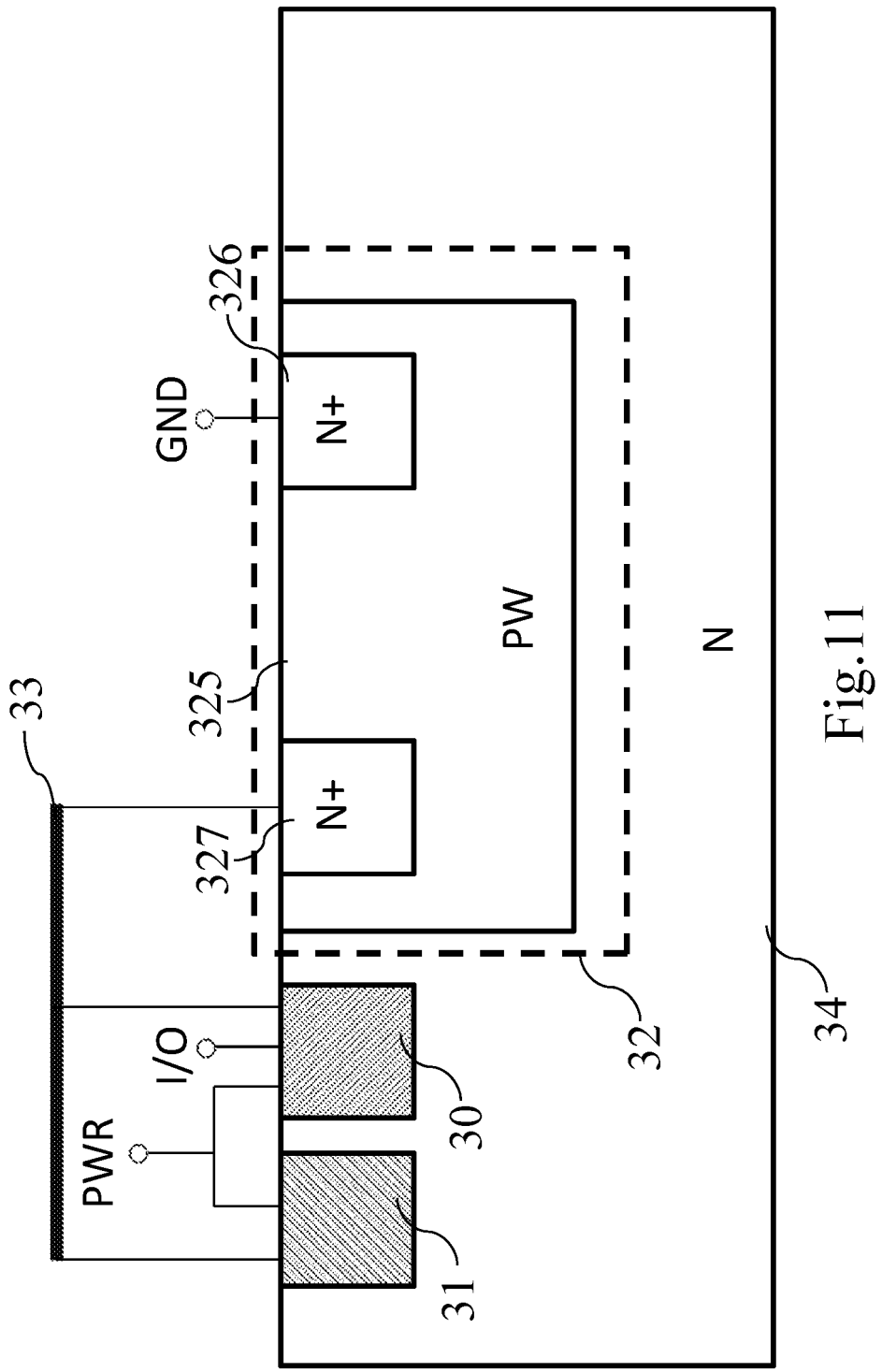
FIG. 11 is a cross-sectional view of a transient voltage suppression device according to a third implementation corresponding to the sixth embodiment of the present invention.

FIG. 11 is a cross-sectional view of a transient voltage suppression device according to a third implementation corresponding to the sixth embodiment of the present invention. Referring to FIG. 11, the diode string 30 and the power clamp device 31 are formed in a semiconductor substrate 34. The semiconductor substrate 34 has a first conductivity type. The bi-directional ESD device 32 is exemplified by a bipolar junction transistor. The bi-directional ESD device 32 may include a doped well 325, a first heavily-doped area 326, and a second heavily-doped area 327. The doped well 325, having a second conductivity type opposite to the first conductivity type, is formed in the semiconductor substrate 34. The doped well 325 is floating. In the third implementation, the first conductivity type is an N type and the second conductivity type is a P type. The first heavily-doped area 326, having the first conductivity type, is formed in the doped well 325 and coupled to the ground terminal GND. The second heavily-doped area 327, having the first conductivity type, is formed in the doped well 325 and coupled to the common bus 33. Compared with the first implementation or the second implementation, the third implementation lacks two heavily-doped areas and thus a smaller layout area.

Figure 12:
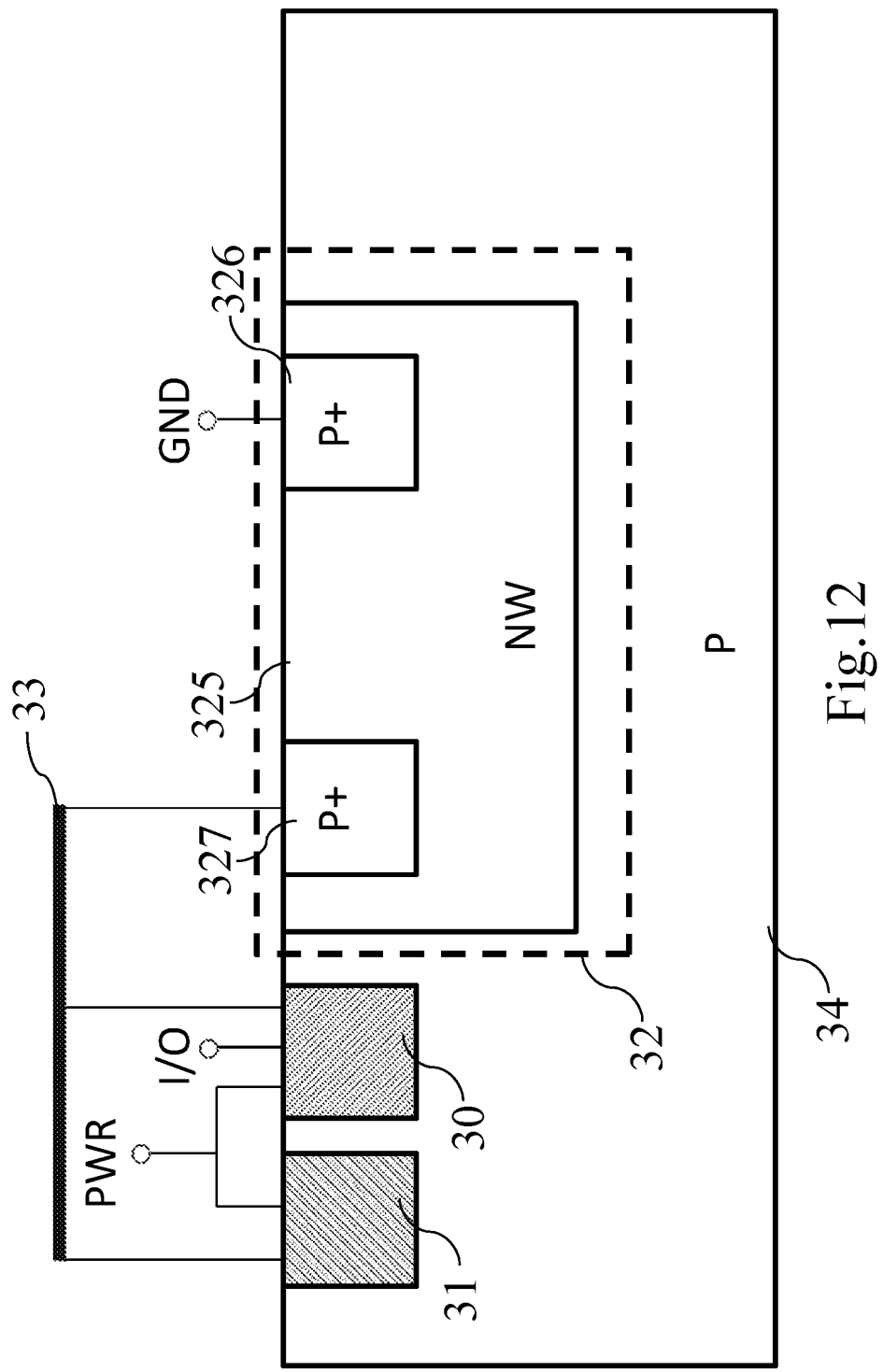
FIG. 12 is a cross-sectional view of a transient voltage suppression device according to a fourth implementation corresponding to the sixth embodiment of the present invention.

FIG. 12 is a cross-sectional view of a transient voltage suppression device according to a fourth implementation corresponding to the sixth embodiment of the present invention. The fourth implementation is different from the third implementation in the conductivity type. In the fourth implementation, the first conductivity type is a P type and the second conductivity type is an N type. The other structures have been described previously in the third implementation so will not be reiterated.

Figure 13:
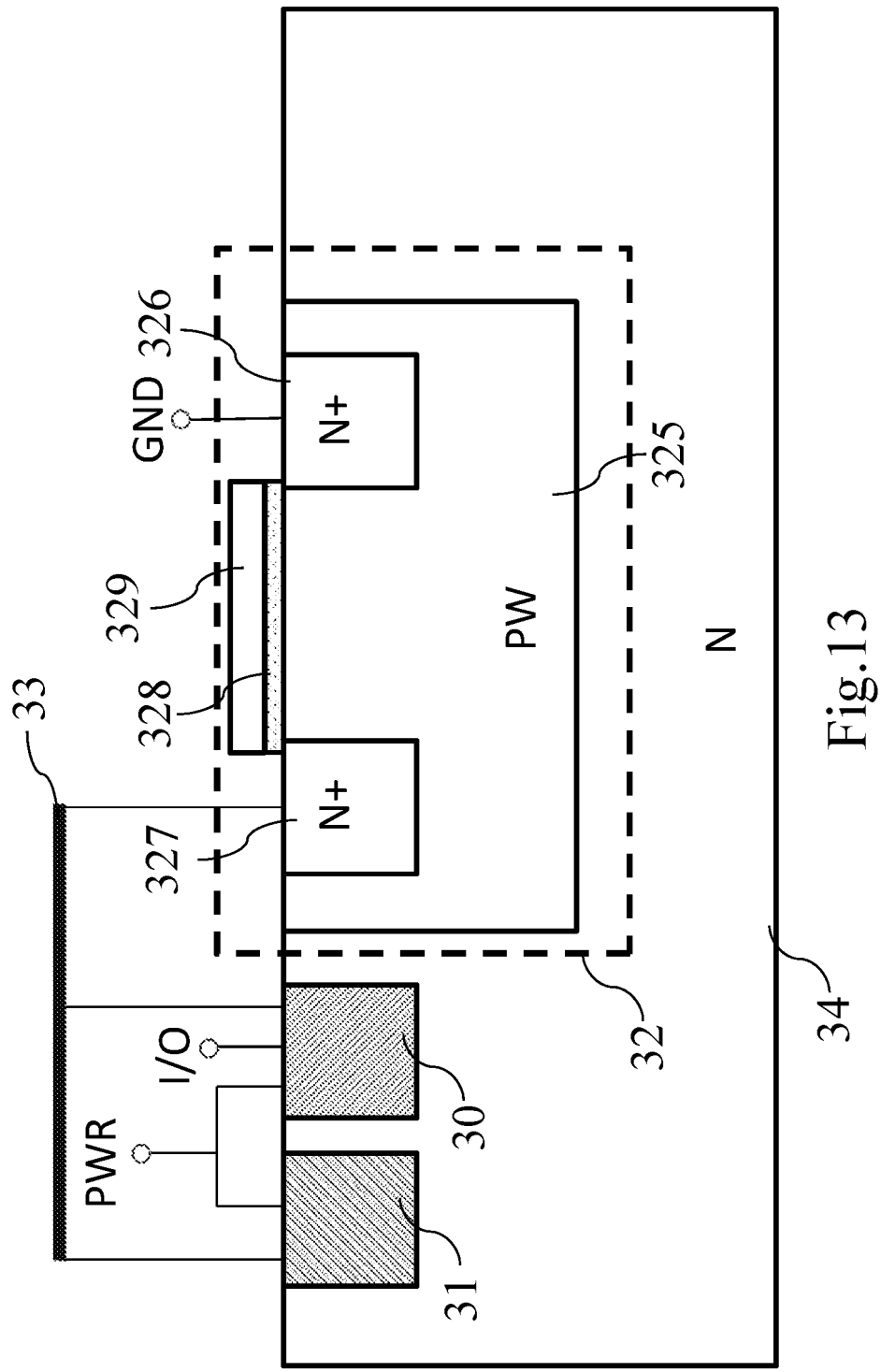
FIG. 13 is a cross-sectional view of a transient voltage suppression device according to a fifth implementation corresponding to the sixth embodiment of the present invention.

FIG. 13 is a cross-sectional view of a transient voltage suppression device according to a fifth implementation corresponding to the sixth embodiment of the present invention. As illustrated in FIG. 13, compared with the third implementation, the fifth implementation further includes an insulation layer 328 and an electrode layer 329 sequentially formed on the doped well 325. The electrode layer 329 is floating. In the fifth implementation, the bi-directional ESD device 32 is exemplified by a metal-oxide-semiconductor field effect transistor.

Figure 14:
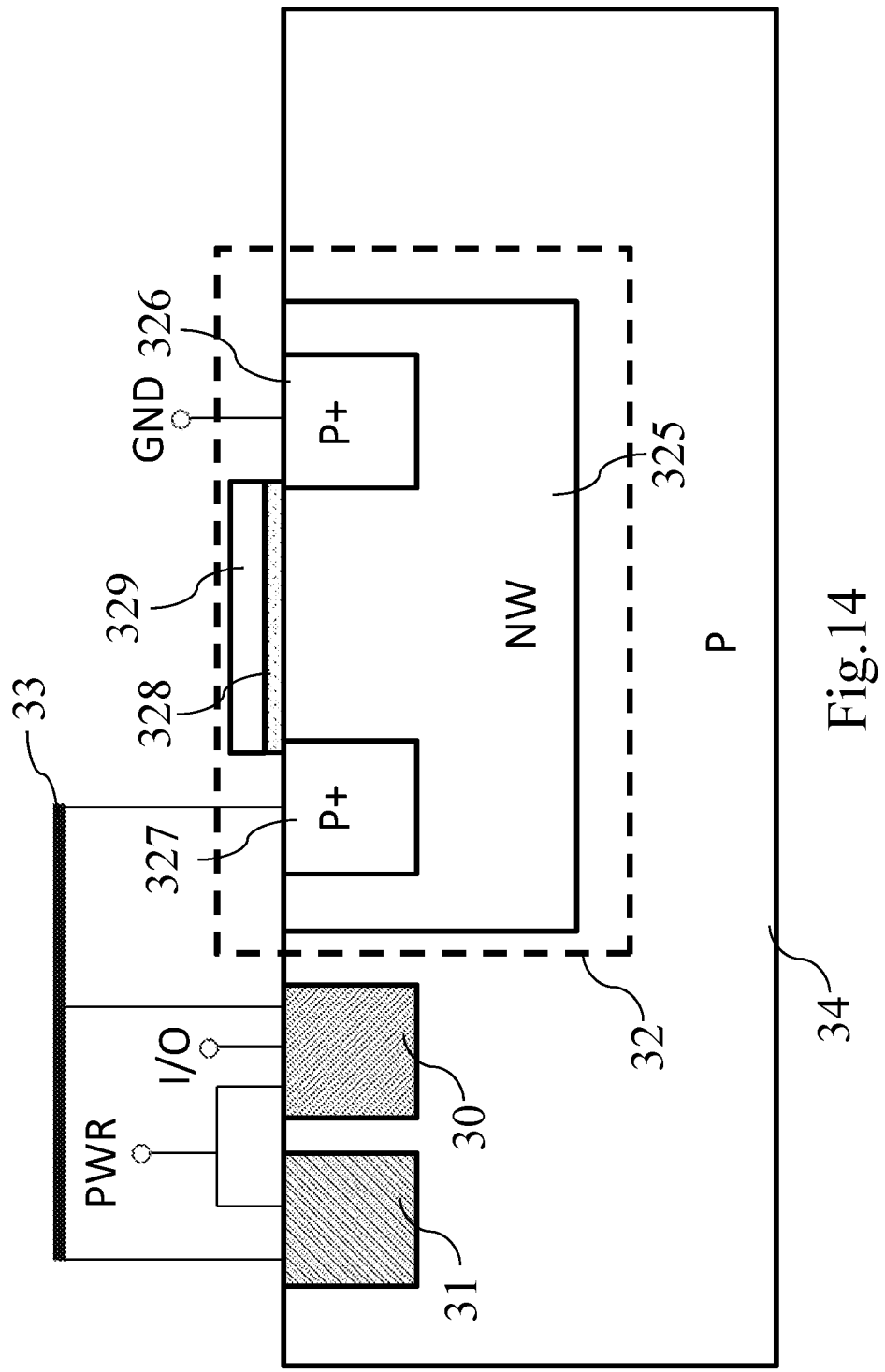
FIG. 14 is a cross-sectional view of a transient voltage suppression device according to a sixth implementation corresponding to the sixth embodiment of the present invention.

FIG. 14 is a cross-sectional view of a transient voltage suppression device according to a sixth implementation corresponding to the sixth embodiment of the present invention. As illustrated in FIG. 14, compared with the fourth implementation, the sixth implementation further includes an insulation layer 328 and an electrode layer 329 sequentially formed on the doped well 325. The electrode layer 329 is floating. In the sixth implementation, the bi-directional ESD device 32 is exemplified by a metal-oxide-semiconductor field effect transistor.

Figure 15:
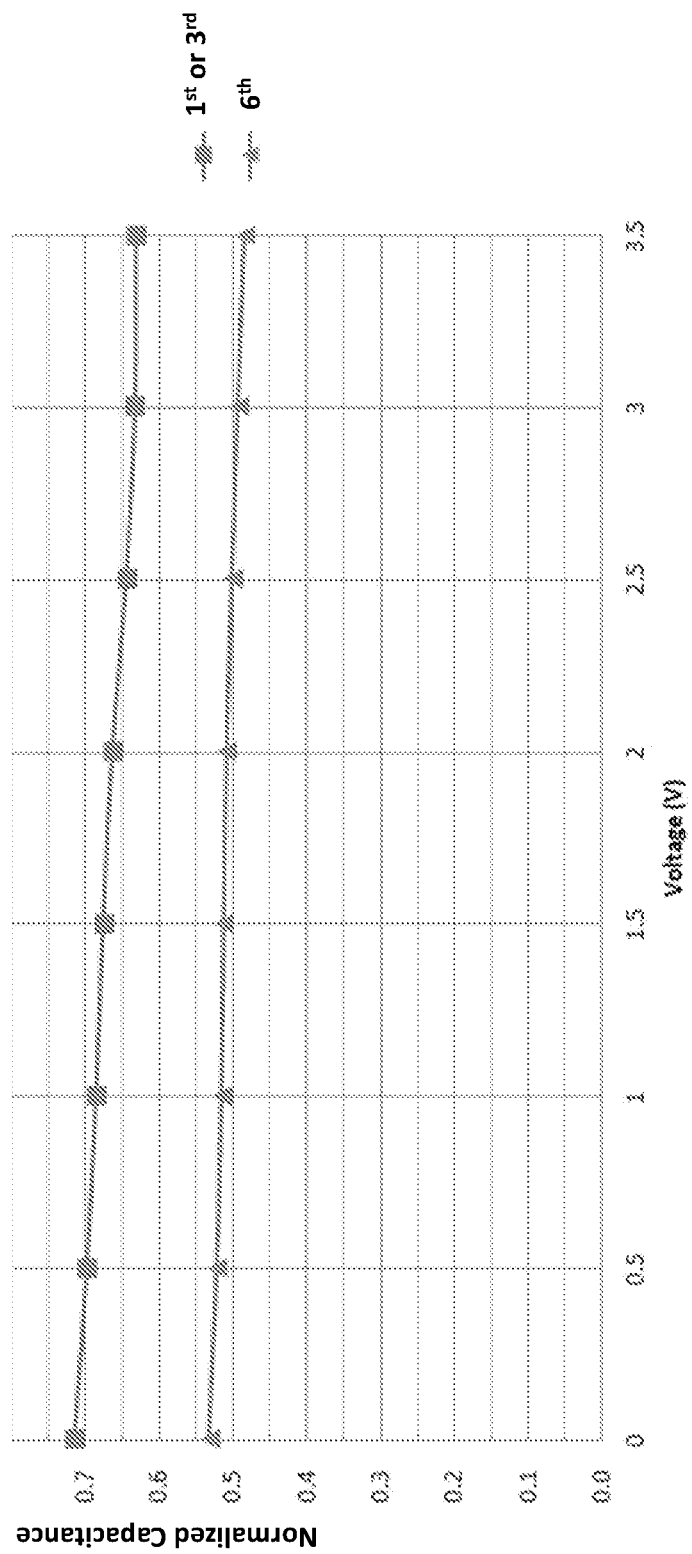
FIG. 15 is a diagram illustrating normalized capacitance versus voltage curves of the first embodiment, the third embodiment, and the sixth embodiment of the present invention.

FIG. 15 is a diagram illustrating normalized capacitance versus voltage curves of the first embodiment, the third embodiment, and the sixth embodiment of the present invention. Referring to FIG. 15, the capacitance on the current dissipation path of the first embodiment or the third embodiment is higher than that of the sixth embodiment.

According to the embodiments provided above, the equivalent capacitances on the current dissipation paths may be reduced accordingly. As a result, regardless of how many channels are included in the transient voltage suppression device, the capacitance values and the holding voltage of the transient voltage suppression device may be adjusted or reduced under premise that the circuit area is not increased to improve the effectiveness of the ESD protection.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A transient voltage suppression device comprising:
at least one diode string coupled between a power terminal and a common bus and coupled to an input output (I/O) port;
a power clamp device coupled between the power terminal and the common bus; and
at least one bi-directional electrostatic discharge (ESD) device coupled between the common bus and a ground terminal,
wherein the at least one diode string and the power clamp device are formed in a semiconductor substrate, the semiconductor substrate has a first conductivity type, and the at least one bi-directional ESD device comprises:

a doped well, having a second conductivity type opposite to the first conductivity type, formed in the semiconductor substrate, wherein the doped well is electrically floating;

a first heavily-doped area, having the first conductivity type, formed in the doped well and coupled to the ground terminal; and a second heavily-doped area, having the first conductivity type, formed in the doped well and coupled to the common bus.

2. The transient voltage suppression device according to claim 1, wherein the at least one diode string comprises:

a first diode with an anode thereof coupled to the I/O port, wherein a cathode of the first diode is coupled to the power terminal; and a second diode with an anode thereof coupled to the common bus, wherein a cathode of the second diode is coupled to the I/O port.

3. The transient voltage suppression device according to claim 1, wherein the at least one bi-directional ESD device is a metal-oxide-semiconductor field effect transistor (MOSFET) or a bipolar junction transistor (BJT).

4. The transient voltage suppression device according to claim 1, wherein the at least one diode string comprises a plurality of diode strings.

5. The transient voltage suppression device according to claim 1, wherein the at least one bi-directional ESD device comprises a plurality of bi-directional ESD devices coupled in series.

6. The transient voltage suppression device according to claim 1, wherein the at least one bi-directional ESD device further comprises an insulation layer and an electrode layer sequentially formed on the doped well, wherein the electrode layer is floating.

7. The transient voltage suppression device according to claim 1, wherein the first conductivity type is an N type and the second conductivity type is a P type.

8. The transient voltage suppression device according to claim 1, wherein the first conductivity type is a P type and the second conductivity type is an N type.

* * * * *